(12) United States Patent
Hohlfeld

(10) Patent No.: US 9,640,511 B2
(45) Date of Patent: May 2, 2017

(54) METHOD FOR PRODUCING A CIRCUIT CARRIER ARRANGEMENT HAVING A CARRIER WHICH HAS A SURFACE FORMED BY AN ALUMINUM/SILICON CARBIDE METAL MATRIX COMPOSITE MATERIAL

(71) Applicant: Infineon Technologies AG, Neubiberg (DE)

(72) Inventor: Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/070,089

(22) Filed: Mar. 15, 2016

(65) Prior Publication Data

US 2016/0284664 A1 Sep. 29, 2016

(30) Foreign Application Priority Data

Mar. 25, 2015 (DE) .................. 10 2015 104 518

(51) Int. Cl.
*H01L 23/00* (2006.01)
*C04B 37/00* (2006.01)
*H01L 23/373* (2006.01)

(52) U.S. Cl.
CPC .............. *H01L 24/83* (2013.01); *C04B 37/00* (2013.01); *H01L 23/3735* (2013.01); *H01L 23/3731* (2013.01); *H01L 23/3733* (2013.01); *H01L 23/3736* (2013.01); *H01L 24/05* (2013.01); *H01L 24/06* (2013.01); *H01L 24/29* (2013.01); *H01L 24/32* (2013.01); *H01L 2224/04026* (2013.01); *H01L 2224/06181* (2013.01); *H01L 2224/291* (2013.01); *H01L 2224/2919* (2013.01); *H01L 2224/29339* (2013.01); *H01L 2224/32227* (2013.01); *H01L 2224/8322* (2013.01); *H01L 2224/8381* (2013.01); *H01L 2224/8384* (2013.01); *H01L 2224/8385* (2013.01); *H01L 2224/83359* (2013.01); *H01L 2224/83424* (2013.01); *H01L 2224/83447* (2013.01); *H01L 2224/83801* (2013.01); *H01L 2224/83851* (2013.01); *H01L 2224/83948* (2013.01)

(58) Field of Classification Search
CPC ........... H01L 24/83; H01L 2224/83948; H01L 2224/8322; H01L 2224/8381; H01L 2224/83359
See application file for complete search history.

(56) References Cited

U.S. PATENT DOCUMENTS

2008/0079021 A1* 4/2008 Bayerer ................ H01L 23/373
257/177

* cited by examiner

*Primary Examiner* — Kyoung Lee
(74) *Attorney, Agent, or Firm* — Murphy, Bilak & Homiller, PLLC

(57) ABSTRACT

According to a method for producing a circuit carrier arrangement, a carrier which has a surface section formed by an aluminum/silicon carbide metal matrix composite material is provided. A circuit carrier, which has an insulation carrier with a lower side onto which a lower metallization layer is applied, is also provided. A bonding layer, which contains a glass, is generated on the surface section. A material-fit connection between the bonding layer and the circuit carrier is produced by means of a connecting layer.

14 Claims, 1 Drawing Sheet

METHOD FOR PRODUCING A CIRCUIT CARRIER ARRANGEMENT HAVING A CARRIER WHICH HAS A SURFACE FORMED BY AN ALUMINUM/SILICON CARBIDE METAL MATRIX COMPOSITE MATERIAL

PRIORITY CLAIM

This application claims priority to German Patent Application No. 10 2015 104518.4 filed on 25 Mar. 2015, the content of said application incorporated herein by reference in its entirety.

TECHNICAL FIELD

The present invention relates to a method for producing a circuit carrier arrangement.

BACKGROUND

During the production of electronic modules, carriers made of an aluminum/silicon carbide metal matrix composite material (also referred to below as AlSiC-MMC material) are often used. When other elements of the circuit carrier arrangement are intended to be connected to such an AlSiC-MMC carrier, for example by soldering, the surface of the carrier is often precoated with a layer of nickel, for example in order to increase the solderability.

However—before it is coated with nickel—there is aluminum oxide ($Al_2O_3$) and/or silicon carbide (SiC) and/or carbon (C) on the surface of such a carrier. The aluminum oxide results from oxidation of the aluminum contained in the carrier, while silicon carbide (SiC) and carbon (C) are residues from the process for producing AlSiC. Since nickel does not wet on silicon carbide, carbon and $Al_2O_3$, the aforementioned preliminary coat of nickel does not adhere optimally to the carrier. Accordingly, the strength of a connection between a circuit carrier and an AlSiC-MMC carrier precoated with nickel is also not optimal.

SUMMARY

The object of the present invention is to provide a method with which it is possible to produce a very strong connection between a circuit carrier and a carrier which comprises an AlSiC-MMC material. This object is achieved by a method for producing a circuit carrier arrangement as claimed in patent claim 1. Dependent claims relate to configurations and refinements.

According to an embodiment, a carrier which has a surface section formed by an aluminum/silicon carbide metal matrix composite material is provided. A circuit carrier, which has an insulation carrier with a lower side onto which a lower metallization layer is applied, is also provided. A bonding layer, which contains a glass, is generated on the surface section of the carrier. A material-fit connection between this bonding layer and the circuit carrier is produced by means of a connecting layer. The glass contained in the bonding layer leads to a very strong connection to the AlSiC-MMC material.

BRIEF DESCRIPTION OF THE DRAWINGS

The invention will be explained below with the aid of exemplary embodiments with reference to the appended figures. The representation in the figures is not true to scale.

In the figures, elements which are the same or which correspond to one another are provided with the same references.

DETAILED DESCRIPTION OF THE DRAWINGS

Figure 1:
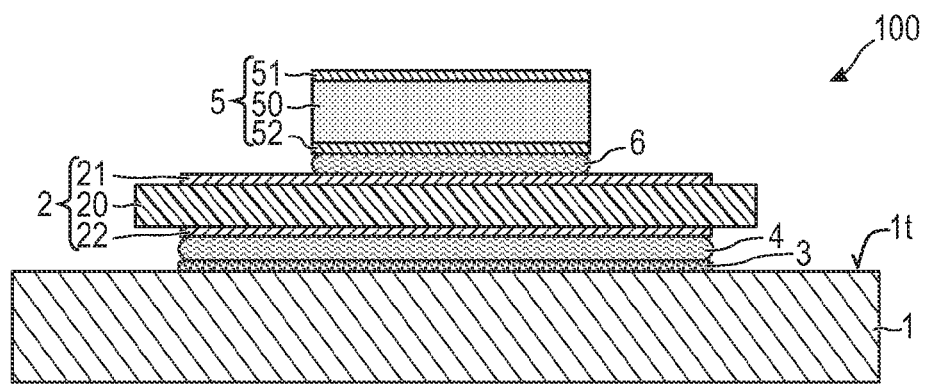
FIG. 1 shows a cross section through a circuit carrier arrangement.

FIG. 1 shows a cross section through a circuit carrier arrangement 100. The circuit carrier arrangement 100 has a carrier 1. The carrier 1, which may for example be configured as a flat or essentially flat plate, comprises an aluminum/silicon carbide metal matrix composite material, or consists of such a material. At least one surface section 1t of the carrier 1 is formed by the AlSiC-MMC material. In this context, it should be pointed out that the formulation "is formed by the AlSiC-MMC material" also includes the possible presence of contamination with at least one of the materials aluminum oxide, silicon carbide and carbon.

The carrier 1 is connected with a material fit to a circuit carrier 2, which has a dielectric insulation carrier 20 with an upper side 20t and a lower side 20b opposite the upper side. The dielectric insulation carrier 20 may, for example, be a ceramic layer, for example consisting of or comprising aluminum oxide ($Al_2O_3$).

The circuit carrier 2 furthermore has at least one lower metallization layer 22, which is applied onto the lower side 20b of the insulation carrier 20. Optionally, the circuit carrier 2 may also have an upper metallization layer 21, which is applied onto the upper side 20t of the insulation carrier 20. If an upper metallization layer 21 is present, this may be structured or unstructured. The lower metallization layer 22 and, if present, the upper metallization layer 21 may for example consist of copper or a copper alloy, or aluminum or an aluminum alloy. In principle, however, any other desired metals, in particular solderable metals, may also be used.

For example, the circuit carrier 2 may be a DCB substrate on which the metallization layer 21 and, if present, the metallization layer 22 may consist of copper or copper alloys and be connected to an $Al_2O_3$ insulation carrier 20 by means of the known DCB method (DCB=Direct Copper Bonding).

Furthermore, the circuit carrier 2 may optionally be equipped with any desired electronic component 5, i.e. connected to the latter by a material fit. For example, such a component 5 may be a semiconductor component, for example a diode, an IGBT, a MOSFET, a JFET, an HEMT (High Electron Mobility Transistor), etc. According to the example shown, such a component 5 may have electrodes 51 and 52, as well as a component body 50, which in the case of a semiconductor component is a semiconductor body.

A bonding layer 3, which contains a glass, is applied onto the surface section 1t. Because of the glass contained in it, the bonding layer 3—despite the possible presence of carbon, silicon carbide and aluminum oxide—adheres very well to the surface section 1t. The carrier 2 is connected by a material fit on the lower metallization layer 22 by means of a connecting layer 4 to the bonding layer 3, and therefore also by a material fit to the carrier 1.

If an electronic component 5 is present, this may be connected by a material fit to the circuit carrier 2 by means of a further connecting layer 6.

Figure 2A:
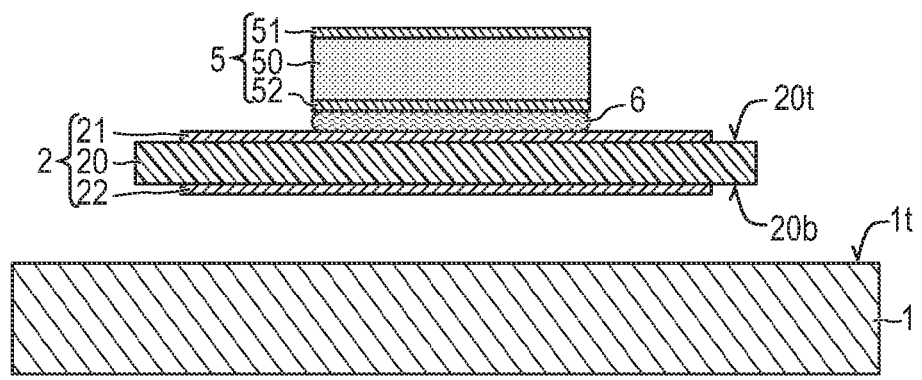
FIGS. 2A and 2B show various steps of a method for producing a circuit carrier arrangement according to FIG. 1.
Figure 2B:
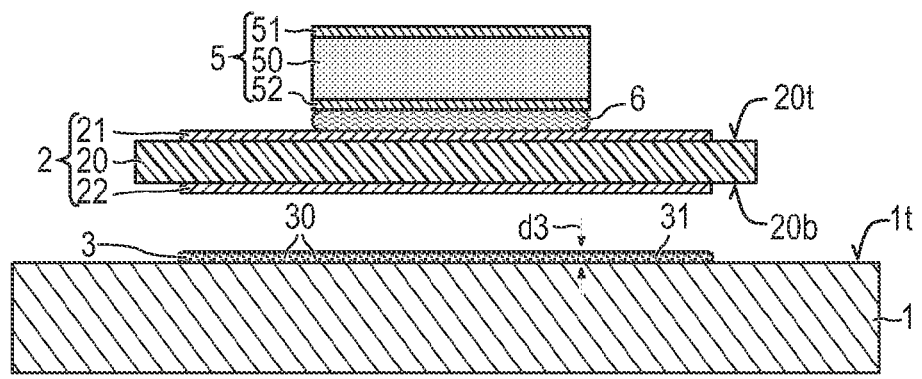

The production of an arrangement of this type will be explained below with reference to FIGS. 2A and 2B. First, as shown in FIG. 2A, at least the carrier 1 and the circuit carrier 2 are initially provided. The circuit carrier 2 comprises at least the insulation carrier 20 and the lower metallization layer 22 applied onto the lower side 20b of the latter. Optionally, it may also contain the upper metallization layer 21 applied onto the upper side 20t. Likewise optionally, the circuit carrier 2 may be equipped with one or more electronic components 5 of any desired type, which are respectively connected by means of a connecting layer 6. In this context, the circuit carrier 5 may be pre-equipped with one or more (identical or different) electronic components 5. In this context, "pre-equipped" means that the circuit carrier 2 is equipped with the with one or more components 5 before the material-fit connection between the circuit carrier 2 and the carrier 1 is produced.

If the circuit carrier 2 is present with at least one electronic component 5, the latter may be connected to the circuit carrier 2 by means of any desired connecting layer 6, for example on an upper metallization layer 21. For example, solder layers, layers of a sintered metal powder (for example a silver powder), or electrically conductive or electrically insulating adhesive layers, are suitable as connecting layers 6.

Before the circuit carrier 2, which may or may not be pre-equipped, is connected to the carrier 1 by a material fit, the aforementioned bonding layer 3 is generated on the surface section 1t of the carrier 1. To this end, a paste 31 is applied onto the surface section 1t, which may be done by means of screen or stencil printing for example. Optionally, a cleaning step may also be carried out before the application of the paste 31, in order to remove at least partially (in the ideal case fully) the materials carbon and silicon carbide possibly lying on the surface section 1t, and therefore to improve the adhesion of the bonding layer 3 subsequently produced on the (cleaned) surface section 1t. The cleaning step may, for example, comprise one or more of the following cleaning methods: washing, grinding, compressed-air blasting with solid abrasive (for example sandblasting), etc.

The paste 31 contains at least one (powdered) glass 30 and a solvent. Besides the glass 30, the paste 31 may also contain a metal powder. For example precisely one of the following materials or any desired combination of or comprising two or more of the following materials is suitable as the metal powder: copper (Cu), silver (Ag), silver-palladium (AgPd), gold (Au). In principle, however, any other desired metal powders may also be used. For example, any of the thick-film pastes mentioned in the patent specification DE 69531138 T2 (Fukuda et. al., filing date: 17 Nov. 1995; publication of the patent grant by the European Patent Office: 25 Jun. 2003) and in the associated priority application JP 28644894 A (filing date: 21 Nov. 1994) are suitable as the paste. To this extent, this patent specification and the priority application are fully incorporated into the present disclosure in terms of the composition, production and processing of the thick-film pastes. Other than in the aforementioned patent specification and its priority application, however, for the present invention it is not important for the bonding layer 3 produced from the paste 31 (corresponding to the thick-film paste) to have a particular electrical conductivity. The thickness d3 of the bonding layer 3 generated may therefore also be selected to be very small, and for example the thickness d3 may lie in the range of from 5 μm to 20 μm. In principle, however, thicknesses d3 below or above this range are also possible.

After the application of the paste 31, the latter is dried. The carrier 1 and the dried paste lying on its surface section 1t are then subjected to a heat treatment during which the glass 30 contained in the dried paste 31 is melted. The melting of the glass, and therefore the heat treatment, may preferably be carried out at temperatures below 600° C.

After the melting, the carrier and the dried paste 31, containing the molten glass 30, lying on its surface section 1t are cooled to below the glass transition temperature of the glass 30. As a result, the bonding layer 3 firmly connected to the surface section 1t and therefore to the carrier 1 is thereby formed. The thickness d3 of the finished bonding layer 3 may, for example, be at least 5 μm or at least 8 μm, and/or may be less than 15 μm or less than 50 μm or less than 100 μm. In this case, the thickness d3 is to be determined in a direction perpendicular to the surface section 1t.

The connecting layer 4 may optionally be directly adjacent to the bonding layer 3, and/or directly adjacent to the lower metallization layer 22. The connecting layer 4 may, for example, be a solder layer or a layer of a sintered metal powder (for example a silver powder), which is connected by a material fit both to the bonding layer 3 and to the lower metallization layer 22 during the sintering.

Optionally, the production of the connecting layer 4 may be carried out in an atmosphere containing hydrogen. The paste 31 may therefore optionally be hydrogen-resistant, i.e. not or not significantly attacked by hydrogen.

The present invention obviates the use of nickel layers in order to improve the solderability of the carrier 1. Accordingly, after the production of the material-fit connection between the carrier 1 and the circuit carrier 2, there may be no nickel layer arranged between the surface section 1t and the connecting layer 4, and/or there may be no nickel layer arranged between the surface section 1t and the bonding layer 3.

Since the AlSiC-MMC material is not wetted with solder, when the connecting layer 4 is configured as a solder layer this material can be used as a natural solder stop for the production of this layer. When the solder is still in the liquid state in order to produce the connecting layer 4, it wets only the bonding layer 3 but not the part of the surface section 1t laterally directly adjacent to the bonding layer 3.

Optional the bonding layer 3 extends at least over the region of the lower metallization layer 22 in any lateral direction (i.e. in any direction parallel to the surface section 1t). Likewise optionally, the bonding layer 3 may extend by at most 2 mm beyond the lower metallization layer 22 in any lateral direction.

In a circuit carrier arrangement 100 as described above, the carrier 1 may for example form a base plate of a power semiconductor module.

What is claimed is:

1. A method for producing a circuit carrier arrangement, which comprises:
    provision of a carrier which has a surface section formed by an aluminum/silicon carbide metal matrix composite material;
    provision of a circuit carrier which has an insulation carrier with a lower side onto which a lower metallization layer is applied;
    generation of a bonding layer, which contains a glass, on the surface section;
    production of a material-fit connection between the bonding layer and the circuit carrier by means of a connecting layer.

2. The method as claimed in claim 1, wherein the generation of the bonding layer containing a glass is carried out by:
    applying a paste containing a glass onto the surface section;
    drying the applied paste;

subjecting the carrier and the dried paste lying on its surface section to a heat treatment during which the glass contained in the dried paste is melted; and cooling the carrier and the dried paste, containing the molten glass, lying on its surface section after the heat treatment to below the glass transition temperature of the glass.

3. The method as claimed in claim 2, wherein the carrier and the dried paste lying on its surface section are not heated to more than 600° C.

4. The method as claimed in claim 2, wherein the paste contains a metal powder.

5. The method as claimed in claim 4, wherein the metal powder contains precisely one or any combination of two or more of the following materials: Cu, Ag, Pd, Au.

6. The method as claimed in claim 1, wherein the bonding layer has a thickness of more than 5 μm.

7. The method as claimed in claim 1, wherein the bonding layer has a thickness of less than 100 μm or less than 50 μm or less than 15 μm.

8. The method as claimed in claim 7, wherein the application of the paste containing the glass is carried out by screen or stencil printing.

9. The method as claimed in claim 1, wherein the glass has a glass transition temperature below 600° C.

10. The method as claimed in claim 1, wherein the connecting layer is configured as a solder layer, or as a layer which contains a sintered metal powder.

11. The method as claimed in claim 1, wherein the connecting layer
is directly adjacent to the bonding layer; and/or
is directly adjacent to the lower metallization layer.

12. The method as claimed in claim 1, wherein the insulation carrier of the circuit carrier provided has an upper side, opposite the lower side onto which an upper metallization layer is applied.

13. The method as claimed in claim 1, wherein the circuit carrier provided is equipped with a semiconductor chip.

14. The method as claimed in claim 1, wherein, after the production of the material-fit connection,
no nickel layer is arranged between the surface section and the connecting layer; and/or
no nickel layer is arranged between the surface section and the bonding layer.

* * * * *